United States Patent [19]

Groff

[11] 4,041,483
[45] Aug. 9, 1977

[54] ABSOLUTE INCREMENTAL HYBRID SHAFT POSITION ENCODER

[75] Inventor: Alvin H. Groff, Cedar Rapids, Iowa

[73] Assignee: Rockwell International Corporation, El Segundo, Calif.

[21] Appl. No.: 569,414

[22] Filed: Apr. 18, 1975

[51] Int. Cl.² .................. H03K 13/02; G01D 5/34
[52] U.S. Cl. .......................... 340/347 P; 250/231 SE; 340/347 M
[58] Field of Search ................ 340/347 P, 347 M; 250/231 SE

[56] References Cited

U.S. PATENT DOCUMENTS

| | | | |
|---|---|---|---|
| 2,656,106 | 10/1953 | Stabler | 340/347 P |
| 2,900,629 | 8/1959 | Daniels | 240/347 P |
| 2,901,170 | 8/1959 | Poole | 340/347 P |
| 2,993,200 | 7/1961 | Walker et al. | 340/347 P |
| 3,096,444 | 7/1963 | Seward | 340/347 P |
| 3,098,152 | 7/1963 | Von Mathes | 340/347 P |
| 3,135,954 | 6/1964 | Francisco | 340/347 P |
| 3,461,307 | 8/1969 | Rusling et al. | 340/347 P |
| 3,594,764 | 7/1971 | Walsh | 340/347 P |

*Primary Examiner*—Thomas J. Sloyan
*Attorney, Agent, or Firm*—Terry M. Blackwood; Robert J. Crawford

[57] ABSTRACT

An incremental type shaft position encoder which provides a distinguishable signal at each of a plurality of predetermined shaft rotational positions, and which further provides a unique electrical signature associated with each of predetermined ones of the signals.

11 Claims, 14 Drawing Figures

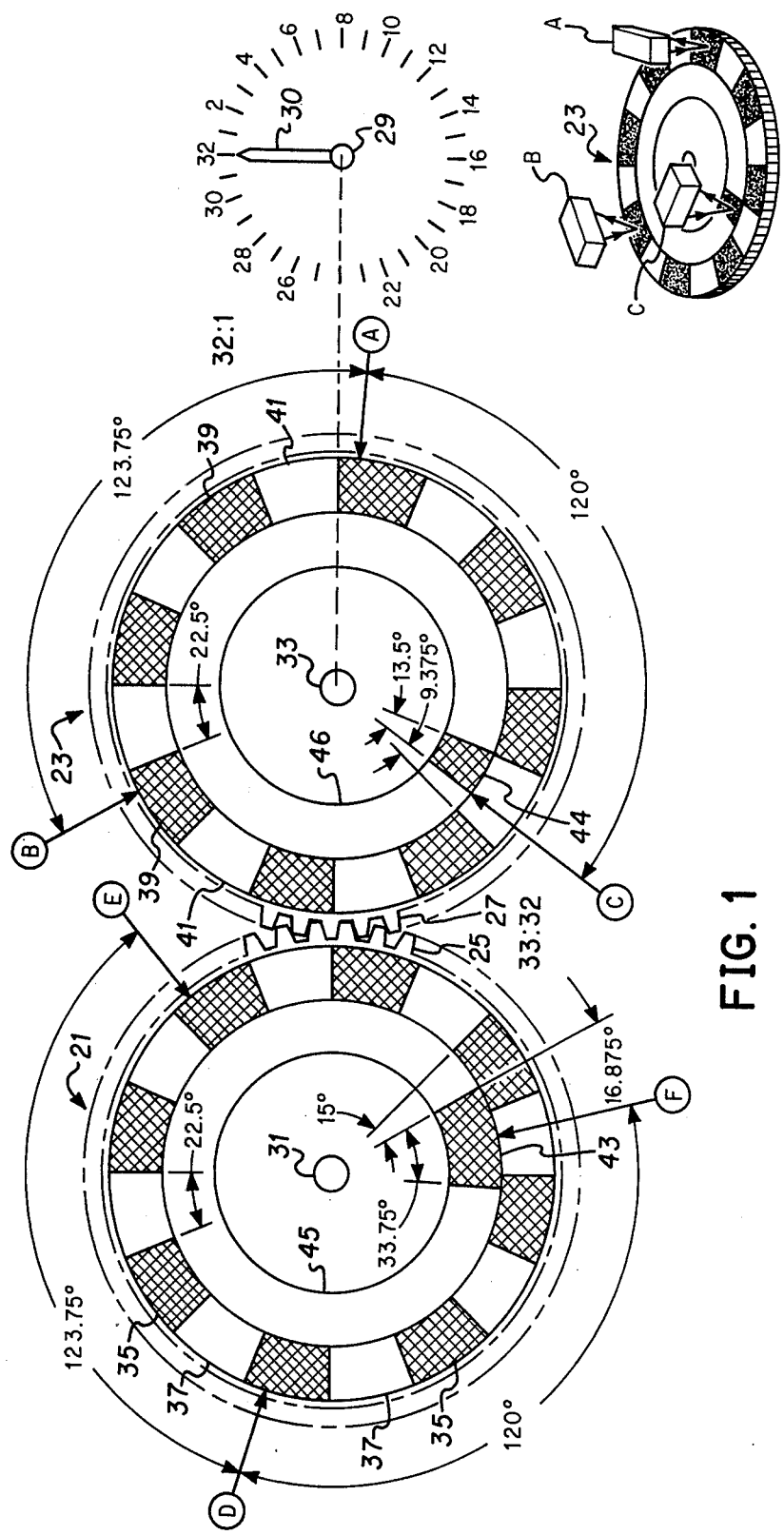

ABSOLUTE INCREMENTAL HYBRID SHAFT POSITION ENCODER

This invention relates to the field of shaft position to digital encoding.

As is well known in the art (see Hoeschele's book entitled, "Analog to Digital/to Analog Conversion Techniques", 1968, Publisher, John Wiley & Sons) a shaft position encoder is a device for converting or translating the angular position of a shaft into some digital format or code. The three basic techniques for mechanizing these encoders may briefly be described as optical, brush contact, and magnetic. In each mechanization, coded patterns made up of two different areas (e.g., conducting and insulating, or reflecting and absorbing, or transmitting and blocking, or magnetic and nonmagnetic) trigger appropriate sensors (e.g., photo detectors, or brushes, or magnetic heads) as the shaft rotates such that an electrical signal in digital format is generated. Irrespective of the basic mechanization employed, there are two basic types of shaft position encoders: absolute and incremental. The absolute encoder provides a unique parallel bit digital word for each shaft position. Hence to encode $2^x$ shaft positions, there must be $x$ sensors and $x$ distinct and appropriately coded patterns of the two different areas. Thus to encode 1024 shaft positions, ten sensors and ten different coded patterns (i.e., tracks) would be required. Generally, the more tracks required, the bulkier the encoder becomes because of the physical limitations in resolution capability. Moreover, since the position sensors represent the major cost of an encoder, use of an absolute encoder to encode a large number of shaft positions becomes impractical in many systems applications.

An incremental encoder generates a voltage or current transition for each increment of shaft angular rotation. Such encoders are generally used, not to determine absolute shaft position, but to measure shaft rotational displacement from an arbitrary starting position. Generally, the transitions are counted with respect to an arbitrary shaft starting position and a memory of some kind is employed to determine any new shaft position relative to the arbitrary starting position. Thus neither the starting nor new positions are generally known absolutely, and only their rotational separation is determinable.

Accordingly, an object of this invention is the provision of shaft position encoder means of the incremental type which permits determination of absolute shaft position. Moreover the present invention is capable of encoding large numbers of shaft positions with fewer sensors than would be required by absolute encoders of equal capacity.

These and other objects, features, and advantages of the invention will become more apparent upon reference to the following specification and appended drawings in which:

FIG. 1 represents the presently preferred embodiment of the invention;

FIG. 2 is a perspective view of a portion of FIG. 1;

Figure 3:
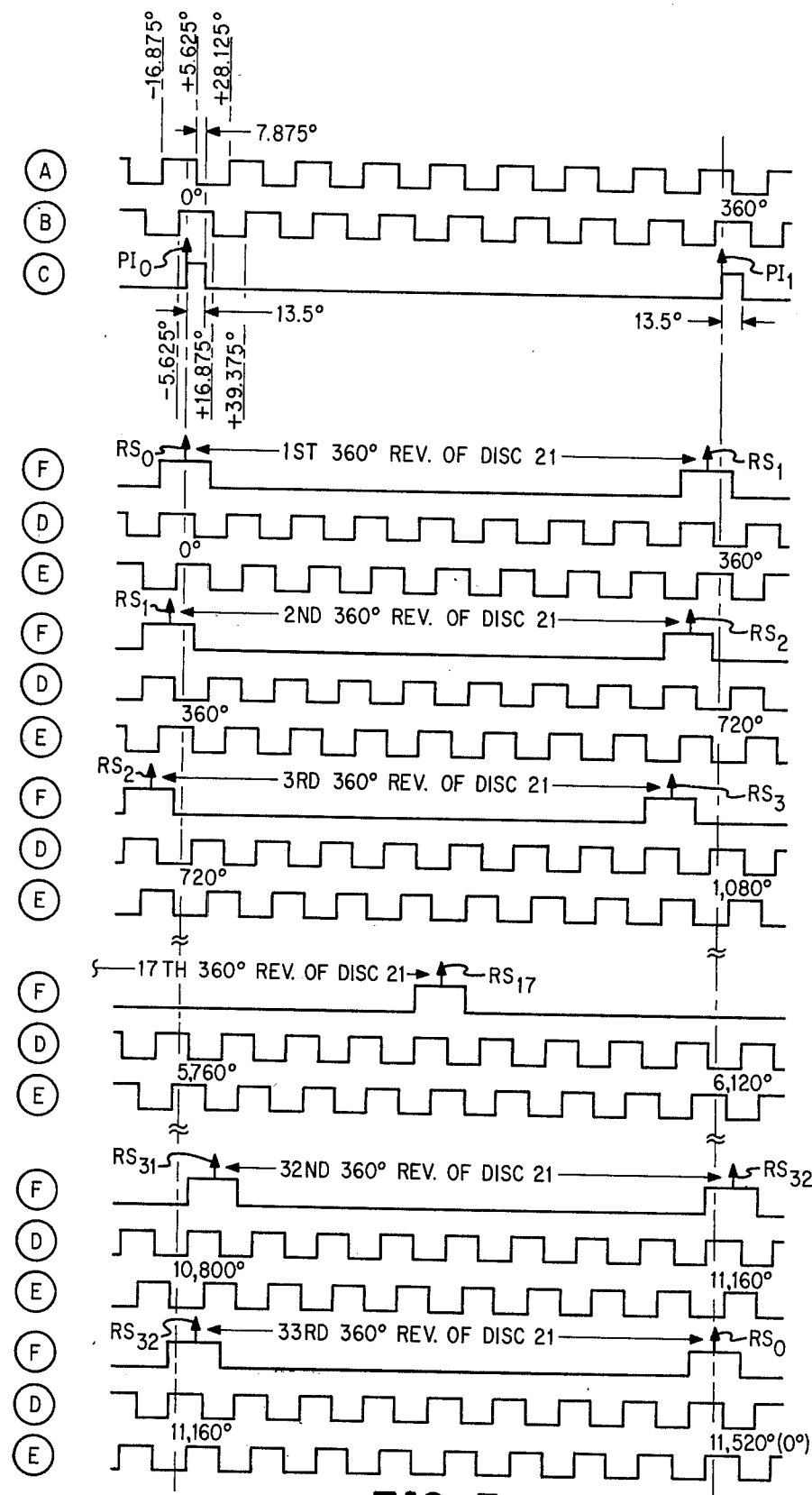
FIG. 3 illustrates waveforms useful in explaining the operation of the FIG. 1 apparatus.

The presently preferred embodiment depicted in FIG. 1 comprises two encoded rotatable dics 21 and 23 and six appropriately located sensors A, B, C, D, E, and F. Discs 21 and 23 are attached to the sides of gears 25 and 27 which are in turn coupled via other gears (represented schematically by the dotted line) to a shaft 29, which in the preferred application, bears an instrument pointer 30. Gears 25 and 27 are rotationally driven on their shafts 31 and 33 by a motor and appropriate coupling not shown. On each of coded discs 21 and 23 is a pattern of light reflective area (represented by the crosshatched segments) and nonreflective areas. (In the presently preferred embodiment, each patterned disc is constructed by silk-screening flat black paint in the appropriate pattern onto a shiny metal disc.) The pattern of each disc comprises two circular tracks radially displaced from one another and the outer track of each pattern comprises sixteen equiangular and alternating reflective and nonreflective areas. More particularly, the outer track of disc 21 comprises eight reflective areas 35 individually alternating with eight nonreflecting areas 37, and each of the sixteen areas is bounded by a pair of radii angularly separated by an angle $\phi$ which is 1/16, or 22.5°, of a 360° revolution of disc 21. In like manner, the outer track of disc 23 comprises eight reflective areas 39 individually alternating with eight nonreflective areas 41, and each of these sixteen areas is bounded by a pair of radii angularly separated by an angle $\theta$ which is 1/16, or 22.5°, of a 360° revolution of disc 23.

The inner track of each disc 21 and 23 comprises one relatively small reflective area (designated 43 and 44 respectively) and one relatively large nonreflective area (designated 45 and 46 respectively). This relatively small reflective area 43 of disc 21 is bounded by a pair of radii angularly separated by 33.75° of a 360° revolution of disc 21. The relatively small reflective area 44 of disc 23 is bounded by a pair of radii anguarly separated by 13.5° of a 360° revolution of disc 23. Each of the relatively large nonreflective areas 45 and 46 extends respectively over the remainder of its disc's inner track.

The exact preferred position of each inner track on its respective disc is shown in FIG. 1. However, as will become more apparent hereinbelow, it is sufficient that a reflective area be presented to the inner track sensor simultaneously with each of the outer track sensors being presented with a reflective area.

As depicted in FIGS. 1 and 2, sensors A, B, C, D, E, and F are disposed radially and axially in a predetermined manner with respect to the two discs. More particularly the two sensors D and E which are associated with disc 21 outer track are angularly separated by a 123.75° of a 360° revolution of disc 21. Sensor F, associated with disc 21 inner track, is angularly displaced from sensor D by a 120° of a 360° revolution of disc. 21. In like manner, the two sensors A and B which are associated with the disc 23 outer track are angularly separated by 123.75° of a 360° revolution of disc 23. Sensor C, associated with disc 23 inner track, is angularly displaced from sensor A by 120° of a 360° revolution of disc 23.

In the preferred embodiment, each sensor comprises a phototransistor which generates one binary level when receiving reflected light from the reflecting areas 35, 39, 43, and 44, and which generates the other binary level when receiving substantially no light from the nonreflecting areas 37, 41, 45, and 46. More particularly in the presently preferred embodiment, each sensor comprises the phototransistor portion of a Fairchild light reflective transducer Model No. FPA104. Each transducer also contains an infrared light emitting diode. Also, it is preferable to further amplify and threshold detect the variation of current through the phototransistor resulting from the alternating reflective and nonreflective areas. It should further be noted that although the combination of light reflective track and phototransistor is the presently preferred one for generating the information containing signals described hereinbelow, there are other combinations of detectable segments and appropriate sensors which will generate equivalent information containing signals. For example, as earlier suggested, a combination of conductive (and nonconductive) segments and a brush sensor can generate appropriate and equivalent signals. Also, photoconductive or photovoltaic cells could be used with the above-described reflective tracks to generate appropriate signals.

It should also be noted that for purposes of clarity in FIG. 1, the axial placements of the sensors is only functionally represented. That is, while the arrow from each sensor indicates the true radial placement and true radial line of sensing for each sensor, each said arrow further represents only the appropriate track with which each sensor is associated. FIG. 2 which shows disc 23 and sensors A, B, and C is more representative of the true axial placement of the sensors, and shows that the sensors are located above the encoded disc surface. More particularly, light is transmitted from each of the Fairchild transducers substantially axially down along a ray path to the disc surface and then, when incident upon a light reflective area, is reflected substantially axially back up to the sensor portion of the unit. The transducer units themselves are mounted on a fixture, not shown, such that the axial separation between disc and sensors is typically 0.05 inches. The axial arrangement for disc 21 and sensors D, E, and F is analogous to the one just described for disc 23 and sensors A, B, and C.

It should here be noted that the relatively large spatial separation of the sensors is preferred to facilitate mounting and to reduce the probability of one sensor erroneously detecting an undesired light reflection. However, as will become more apparent below, the sensors may be oriented at many different spatial locations and still generate the electrical waveforms in the desired relationships.

In operation, the discs of FIG. 1 are rotated relative to the sensors and the sensors generate electrical signals such that, per 360° revolution of shaft 29, 1024 different positions of shaft 29 are indicated and 32, of these 1024, each have associated with it a unique electrical signature.

More particularly, in the preferred embodiment, as disc 23 rotates clockwise, the electrical signals represented by the waveforms shown in FIG. 3 are generated by the six sensors. The appropriate label of the generating sensor, A, B, C, D, E, or F, appears to the left of each individual waveform and the waveforms are arranged such that the binary levels of high and low correspond to the sensor detections of, respectively, light reflective areas and nonreflective areas. Moreover, the position shown in FIG. 1 is used as a 0° starting point and the horizontal axis is labeled in degrees of rotation of disc 23. Since disc 23 is used as the reference in FIG. 3 and since the waveforms for A, B, and C associated therewith repeat for each revolution of disc 23, waveforms for A, B, and C are shown only once. Waveforms for D, E, and F are slightly higher in frequency than for A, B, and C and are shown for selected 360° revolutions of disc 21.

Examining now the individual waveforms generated as disc 23 rotates clockwise, the waveform for C is high from 0° to +13.50 and is low from 13.5° to 360.0°. The waveform for A is high from −16.875° to +5.625° and is low from +5.625° to +28.125°. Thereafter, the waveform for A repeats so as to comprise, per 360° revolution of disc 23, 16 alternating high and low intervals each of 22.5°. The waveform for B is high from −5.625° to +16.875° and is low from +16.875° to +39.375°. Thereafter the waveform for B repeats so as to comprise, per 360° revolution of disc 23, 16 alternating high and low intervals each of 22.5°. The signals from A and B are substantially in phase quadrature and each undergoes sixteen voltage or current transitions from high to low or low to high (a total of 32 transitions) during each 360° revolution of disc 23.

For the preferred embodiment, sensor C and its associated track provide signals herein designated as position index signals (represented by the vertical arrows superimposed on the C waveform), each of which indicates the beginning, or end of one revolution of disc 23. More particularly, the edges of signal C are detected with one-shots and these edge located pulses are AND'ed with signals A and B. The resulting pulses out of the AND gate which occur substantially at 0°, 360°, 720°, 1080°, etc., are employed as the position index signals. Since these position index signals are instrumental in making an updated determination of absolute shaft position, it is of course preferable to locate the position index signals close to the mechanical reference lines of 0°, 360°, 720°, etc. It should be apparent that producing the position index signals in the above described manner may be avoided. For instance, if the width and location of the disc 23 inner track reflective area are appropriately laid out and if sensor resolution is appropriate, the signal from C will be a considerably narrower pulse than the one illustrated in FIG. 3 and thus may be employed directly as the position index signal. However, layout and construction of the inner track, and sensor resolution, are less critical, and thus it is more convenient and preferable, when the above described edge detecting technique is employed.

Examining now the waveforms for D, E, and F, and noting that a left-to-right reading of FIG. 3 again represents a CW rotation of disc 23 and thus a CCW rotation of disc 21, it is seen from an inspection of FIGS. 1 and 3 that these waveforms, when considered on the basis of a 360° revolution of their associated disc 21, are very similar to the waveforms above described for A, B, and C respectively. That is, per complete revolution of disc 21: (i) the signal from F is high for a relatively brief interval and is low otherwise, and (ii) the signals from D and E are substantially in phase quadrature and each undergoes 16 voltage or current transitions (a total of 32 transitions). For the preferred embodiment, sensor F and its associated track provide signals herein designated as reference signals and represented in FIG. 3 by the arrows superimposed on waveform F. As seen from FIG. 3, one reference signal occurs per 360° revolution of disc 21 and each is located between successive transitions of D and E. For the preferred embodiment, the reference signals are provided by AND'ing signals from D, E, and F but as long as each reference signal occurs somewhere within an equivalent interval (i.e., somewhere between the successive D and E transitions next adjacent each arrow representing a reference signal) exact reference signal location within this interval is not critical. Also, similar to comments above with respect to the position index signals, AND'ing sensor signals to produce the reference signals may be avoided, for instance, by appropriate layout of the disc 21 inner track reflective area and use therewith of a sensor having appropriate resolution.

Although the waveforms from each disc are similar when considered in terms of complete revolutions of their respective discs, it is important to note that disc 21 rotates 33 times for every 32 complete revolutions of disc 23. That is, when disc 21 has itself made one complete revolution, disc 23 has itself rotated only through 32/33 of a complete revolution, and when disc 23 has rotated through 360°, disc 21 has rotated (33/32) (360°) or 371.25°. Also note that the sensors and discs are arranged so that a reference signal and a position index signal occur substantially simultaneously at the 0° starting position.

Accordingly, when the first position index signal occurs (i.e., the position index signal at the end of the first 360° clockwise revolution of disc 23) disc 21 has rotated (1 1/32 × 360°) or 371.25°. When the second position index signal occurs (i.e., the position index signal at the end of the second 360° CW revolution, or 720° CW revolution, of disc 23) disc 21 has rotated (2 2/32 × 360°) or (720 + 22.5°). When the third position index signal occurs, disc 21 has rotated (3 3/32 × 360°) or (1080 + 33.75°). In regard to the remaining illustrated revolutions of disc 21, it is seen that when the 17th, 31st and 32nd position index signals occur, disc 21 has rotated (17 17/32 × 360°), (31 31/32 × 360°), and (32 32/32 × 360°) respectively. Note, at the 32nd revolution of disc 23, disc 21 has revolved 33 times so that the two discs are simultaneously back in their original starting positions.

In general, it is seen that as disc 23 turns through an increasing number of complete revolutions, each reference signal occurs increasingly earlier than the same numbered position index signal and moves further to the left of the same numbered position index signal until the two signals have separated by one complete revolution, or 360°, of disc 23 and again occur simultaneously. Stated another way, when the J th position signal occurs, dsic 21 has rotated (33J/32) (360°). Thus the angular separation between the J th position index signal and the J th reference signal, as measured in terms of degrees of rotation of disc 23, increases from 0° to 360° in 11.25° steps as J increases from 0 to 32 in steps of 1.

Also, since at the J th position index signal, disc 21 has rotated (33J/32) × (360°) and since from the D and E waveforms there are 32 substantially evenly distributed voltage or current transitions per 360° revolution of disc 21, there will always be, as seen from FIG. 3, J transitions of D and E between the J th reference signal and the J th position index signal. More particularly, from FIG. 3, it is seen that between the zeroth position index signal and the zeroth reference signal (i.e., those at 0°) there are 0 (zero) D and E transitions. Between the first position index signal (i.e., the position index signal at 360° of disc 23 rotation) and the first reference signal, there is one transition of waveform D. Between the second position index signal (i.e. the position index signal at 720° of disc 23 rotation) and the second reference signal there are two transitions, one each of waveform D and E. Between the third position index signal and the third reference signal there are three transitions, two of D and one of E. This trend continues through the case where there are 32 transitions between the 32nd position index signal and the 32nd reference signal. The 33rd reference signal occurs simultaneously with a position index signal and is thus the same as the zeroth reference signal. In other words, at the 33rd reference signal, both discs are simultaneously back in their original starting positions.

It should now be apparent that each one of 32 complete revolutions of disc 23 is distinguishable from the remaining ones of the 32 revolutions because each of 32 position index signals has associated with it a unique electrical signature. Each electrical signature precedes its associated position index signal and comprises a unique number of voltage or current transitions. More particularly, in the preferred embodiment above described, each electrical signature comprises a unique number of serially occurring D and E voltage or current transitions between a position index signal and a rotationally preceding reference signal.

Returning again to FIG. 1, the significance of the capability to determine which of 32 revolutions disc 23 has completed becomes apparent. In FIG. 1, it is shown that disc 23 and the point-bearing shaft 29 are coupled together such that shaft 29 rotates once, or 360°, for every 32 revolutions of disc 23. Accordingly, a position index signal occurs at every 11.25° of rotation of shaft 29, and a 360° rotation of shaft 29 is divided into 32 sectors (of 11.25° each), each of which is demarcated by a pair of the 32 position index signals. The tick marks around pointer 30 in FIG. 1 indicate the 32 pointer positions at which position index signals occur and the spaces therebetween represent the sectors.

Thus, because each position index signal has associated with it a unique electrical signature and because a position index signal occurs at each of the tick marked shaft positions, each of the 32 tick marked shaft positions has associated with it a unique electrical signature. More particularly as pointer 30 rotates CW from the illustrated 0° position, a first reference signal is generated at (32/33) × (11.25°), a first position index signal is generated at 11.25° (i.e., the first tick mark) and one voltage or current transition (from D and E) is generated therebetween. At (2 × 32/33) × (11.25°) a second reference signal is generated, at 2 × (11.25°) (i.e., the second tick mark) a second position index signal is generated, and two transitions (from D and E) are generated therebetween. This trend continues through the 32nd sector where at (32 × 32/33) × (11.25°) the 32nd reference signal occurs, at 32 × (11.25°) the 32nd position index signal occurs, and therebetween 32 transitions (from D and E) occur.

To summarize, in the preferred embodiment, a 360° rotation of shaft 29 is divided into 32 substantially equal sectors by 32 position index signals, into 33 substantially equal sectors by 33 reference signals, and between the J th reference signal occurring at $(J \times 32/33) \times (11.25°)$ and the J th position index signal occuring a $J \times (11.25°)$ there is always a unique number J of transitions of the D and E signals.

As mentioned earlier, the total number of indicated angular positions of shaft 29 per 360° revolution thereof is 1024. This total is equal to the number of 11.25° sectors (i.e., 32) around shaft 29 times the number of A and B transitions per 11.25° sector (i.e. 32). By appropriately treating the A and B transitions, a different and specifically assigned representation for each of 1024 absolute positions of shaft 29 may be provided. For instance, by appropriately counting each A and B transition which occurs during a rotation of the point from 0° to 360°, such as with an initially zeroed counter of at least ten bit capacity, each particular subtotal of counts accumulated in the counter (i.e., each particular binary word produced by the counter) represents a particular absolute shaft position. However, if this counter is interrupted (as by turning the system off and then back on) or otherwise becomes unreliable such that it is not known whether the actual pointer position is being accurately represented by the count subtotal, then, in accordance with a highly advantageous feature of the present invention, it is only necessary to rotate the pointer through a small angle in order to determine absolute pointer position. That is, the shaft 29 can be rotated from any reference signal location to the next position index signal location, and the absolute location of the pointer, at this position index signal, will be represented by the unique number of voltage or current transitions (of D and E) which have occurred between this signal couple.

Figure 4:
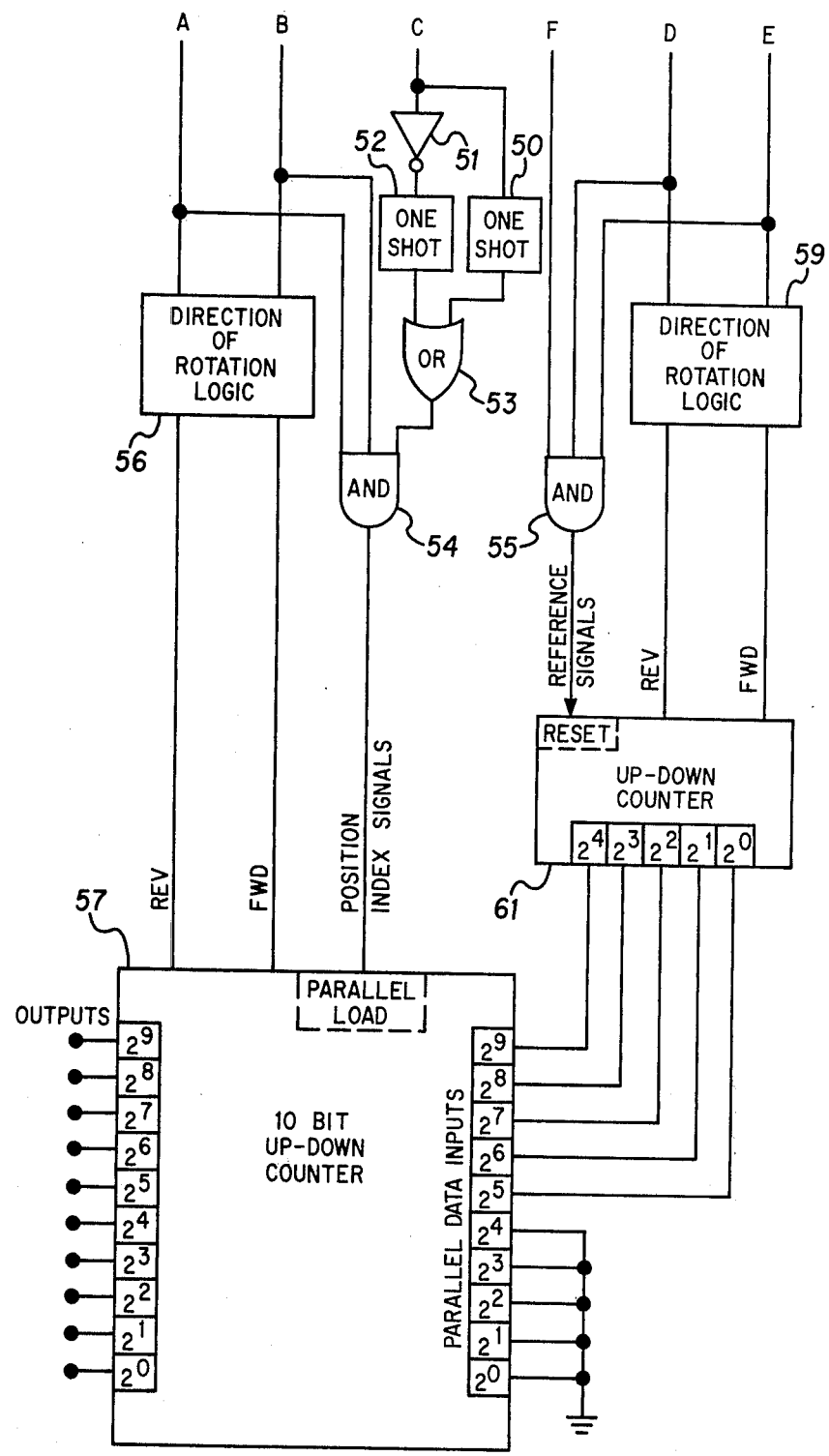
FIG. 4 is a block diagram of apparatus for processing signals available from the FIG. 1 apparatus.

Turning now to means for processing the information available from sensors A through F, FIG. 4 represents one of several possible practical embodiments. As seen in FIG. 4 and as mentioned earlier, short pulses located at the edges of signal C and AND'ed with signals A and B to produce the position index signals. More particularly, the C signal triggers monostable multivibrator 50 and an inverted C signal (from NOT circuit 51) triggers monostable multivibrator 52. The edge located short pulses from one-shots 50 and 52 are fed to OR gate 53 and the signals from A and B and the OR gate 53 and AND'ed in 54 to produce the position index signals. As also seen from FIG. 4, signals D, E, and F are AND'ed in 55 to produce the reference signals. As earlier mentioned, such processing circuits may be avoided by appropriately narrowing the reflective area of each disc's inner track and using therewith a sensor having appropriate resolution. It should also be apparent that if AND'ing is employed, the angular width of the inner track reflective areas should be appropriately limited in order to prevent additional and/or unwanted reference or position index signals.

Figure 5A:
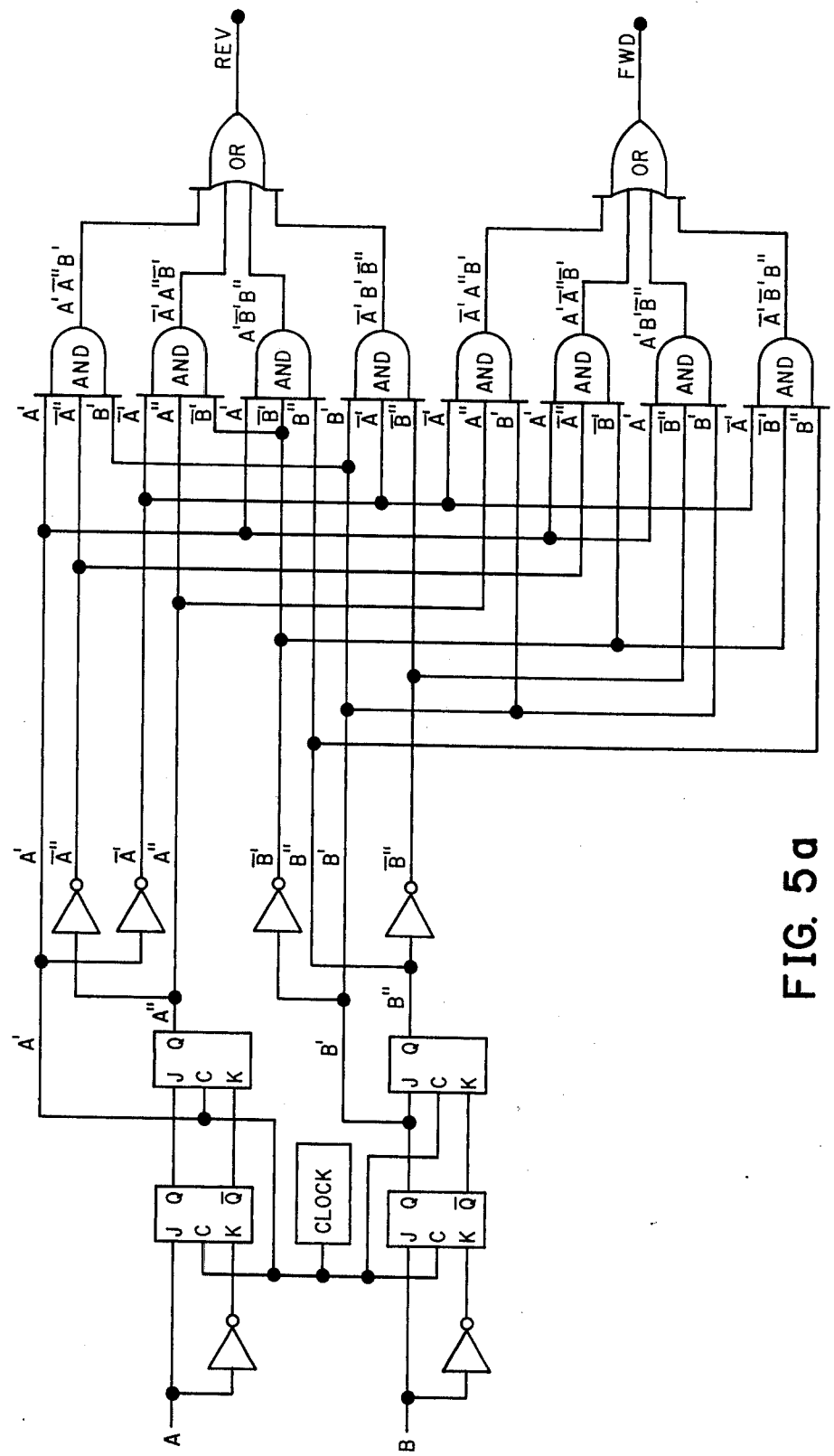
FIG. 5a and 6a are detailed schematics of a portion of the FIG. 4 apparatus.
Figure 5B:
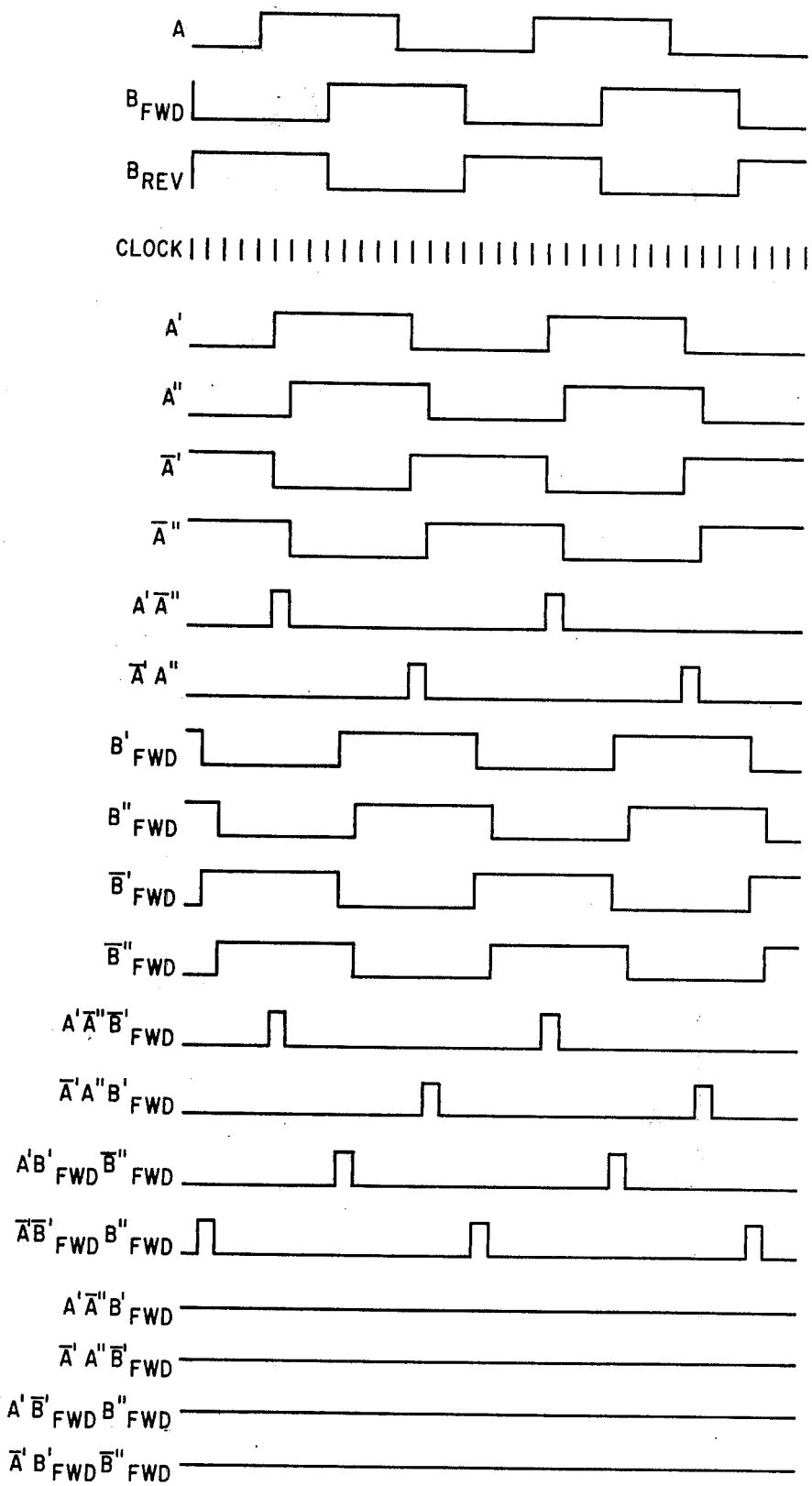
FIGS. 5b and 6b illustrate waveforms useful in explaining the operation of the apparatus of FIGS. 5a and 6a respectively.
Figure 6A:
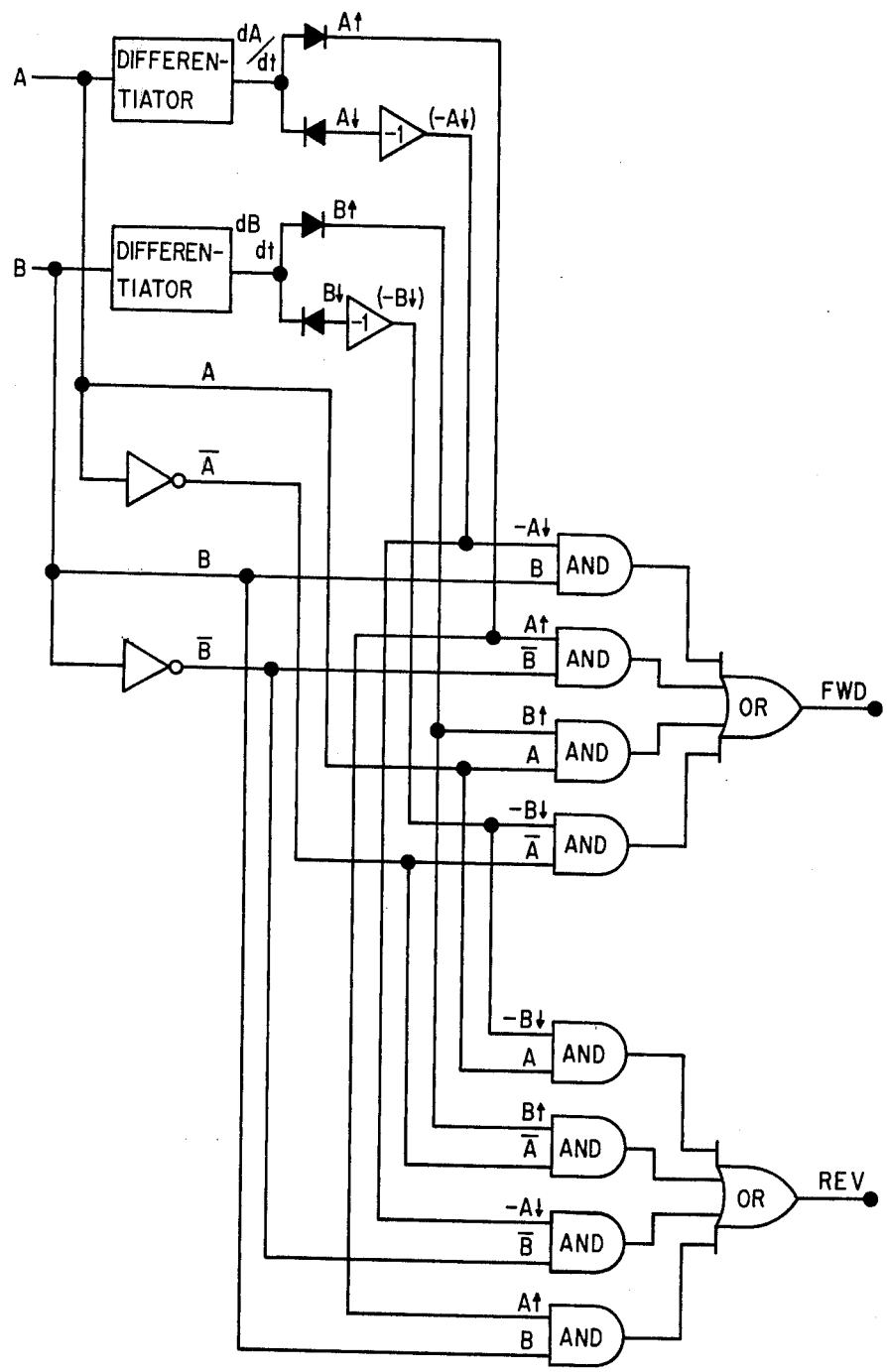
Figure 6B:
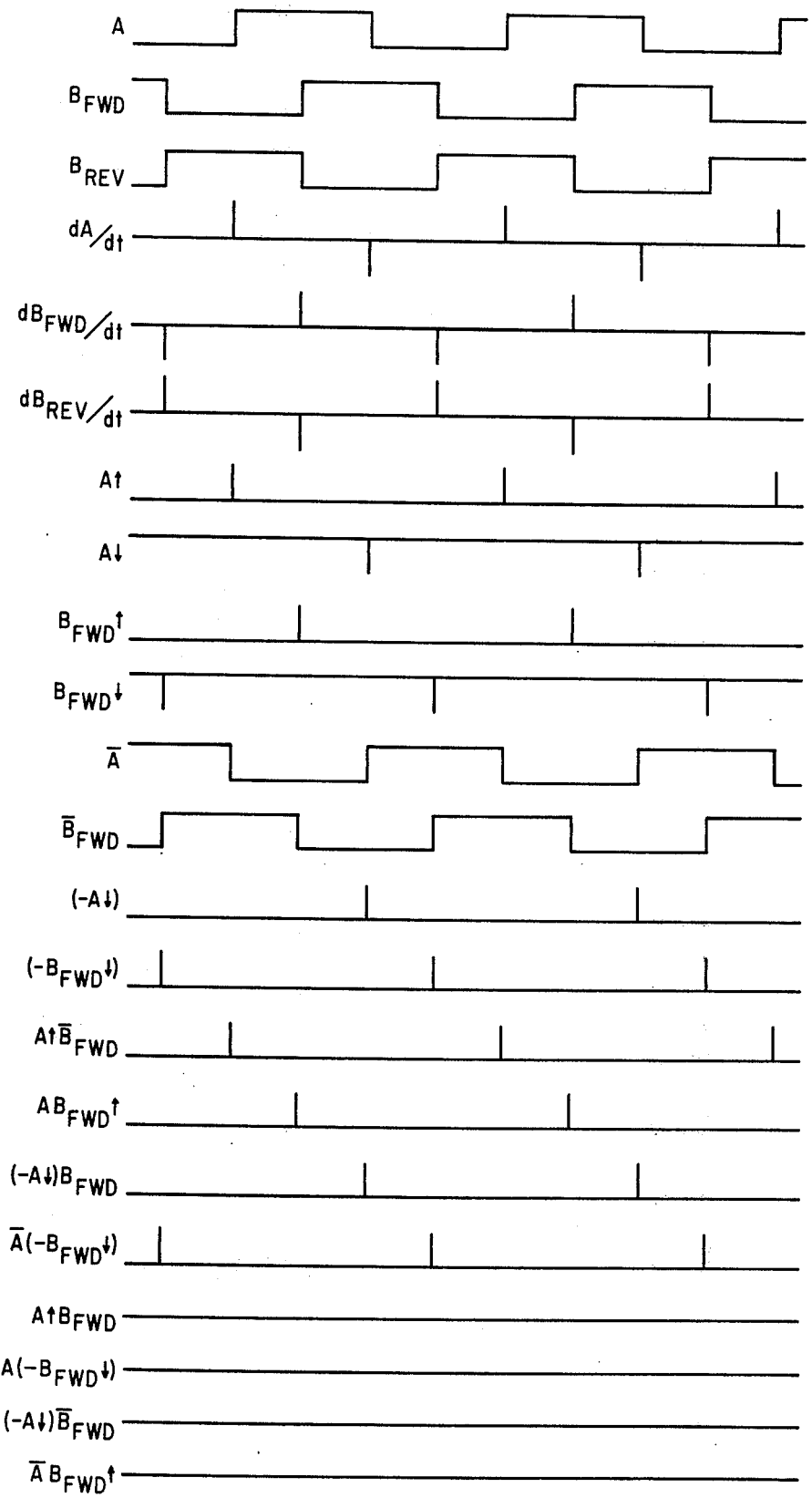

Continuing with FIG. 4, it is further seen that signals from A and B are fed into a logic circuit 56 which provides as an output a pulse for each transition of A or B. Moreover, if desc 23 is rotating in one direction, arbitrarily defined as forward, the pulses occur at the output labeled FWD. Likewise, when disc 23 is rotating in the opposite or reverse direction, the pulses appear at the output labeled REV. Such circuits are well known in the art. (See Electronic Design, Sept. 27, 1973, Page 112.) Briefly, such circuits operate on the principle of detecting whether the phase of one input waveform leads or lags, usually by 90°, the phase of the other input waveform. More particularly, two examples of such circuits are shown in FIGS. 5a and 6a. The operation of each exemplary embodiment, especially in view of FIGS. 5b and 6b which respectively illustrate the operational waveforms therefor, is deemed self-explanatory. It should be noted, however, that FIGS. 5b and 6b illustrate waveforms for a forward rotation condition and thus illustrate the processing of waveforms A and $B_{FWD}$. When direction of rotation reverses, the phase relationship between the signals from A and B changes such that waveforms A and $B_{REV}$ are representative of their new phase relationship. When waveforms A and $B_{REV}$ are inputted to either the FIG. 5a and 6a embodiment, the output pulses will appear at the output labeled REV instead of at the output labeled FWD.

The output of the logic circuit 56 is fed to a ten bit up-down counter 57. For a pulse on the FWD line, the count accumulation of counter 57 increases by one and for a pulse on the REV line, the count accumulation of counter 57 decreases by one.

Practically any conventional up-down counter circuit of those well known in the art (see the above-mentioned book by Hoeschele at Chapter 10) may be employed by appropriately count and accumulate the pulses. However, to update the count, additional storage registers are required and thus it is particularly convenient to employ an up-down counter such as the Texas Instruments type No. SN 54193. With this particular type counter, signals at the parallel data inputs, at the occurrence of a load signal at the load input, are loaded into the counter and supersede by previous count contained therein. It is seen from FIG. 4 that the position index signals are fed to the load input of counter 57.

In like manner to that above described for A and B, signals from D and E are fed to a logic circuit 59 (which is identical to logic circuit 56) for determining direction of rotation. The output of logic circuit 59 are fed to a conventional 5 bit, up-down counter 61. The five outputs of counter 61 are fed to the five most significant bit parallel data inputs of counter 57. The five least significant bit parallel data inputs of counter 57 are tied to a logic zero. For use with the preferred embodiment, the output of counter 61 automatically represents in absolute binary code at each position index signal which of 32 positions pointer 29 is in. (That is, the 5 bit word at counter 61 output is identical with the most significant 5 bits of counter 57.) However, as will become more apparent hereinbelow, a decoder circuit may be required between the outputs of counter 61 and the inputs of counter 57 if, per 360° rotation of disc 23, the number of D and E transitions differs from the number of A and B transitions by more than one, and if it is desired to have the output available in absolute binary code.

In operation, assuming both discs 21, 23 and shaft 29 are initially in their 0° position so that the outputs of counters 57 and 61 are both 0, as pointer 30 rotates clockwise to a location just shy of 11.25°, counter 57 counts 32 A and B transitions and outputs a different parallel bit word (in absolute binary code) for each of the 32 positions. Just prior to the 11.25° location the counter 57 output is 0000100000. Also, during this interval of pointer rotation, counter 61 is presented with indications of 33 D and E transitions, is reset between the 32nd and 33rd transitions by a reference signal, and thus just prior to the 11.25° pointer location provides as an output the 5 parallel bit word 00001. When the pointer arrives at the 11.25° location, a position index signal occurs, loading the output of counter 61 into the most significant 5 bits of counter 57 and loading a logic zero into each of the least significant 5 bits of counter 61. The new ten bit word loaded into counter 61 is the same one as was already there and there is no change in the output of counter 61.

As pointer 30 continues to rotate CW to 360° this basic procedure is repeated 31 more times such that for a complete 360° rotation of the pointer, counter 57 has counted 1024 A and B transitions, has outputted a different word (in absolute binary code) for each of 1024 positions, and has been updated (but without change in its output) at each of 32 position index signals with a unique 5 parallel bit word outputted by counter 61. For reverse or CCW rotation of the pointer, counter 57 of course reduces its output according to the number of A and B transitions encountered so that the correct word is outputted. Counter 61 also counts down from the point of reversal so that the correct unique 5 bit word is outputted at each of the 32 position index signals. As before, counter 57 is updated at each of the position index signals by the 5 bit word from counter 61 and the 5 logic zeros, and as long as the count accumulation in counter 57 is accurate, no change in counter 57 output is produced by the updating.

The capability of updating the output of counter 57 becomes significant in the case where for some reason the output of counter 57 is unreliable and is thus not a reliable indication of true pointer position. That is, if the output of counter 57 is incorrect, it is changed to the correct output at a position index signal following a reference signal. This is of course because the output of counter 61, following a reference signal reset, is always representative of the pointer position at a position index signal, and this output together with the 5 logic zeros supersedes the previous incorrect output. As the pointer rotates past this occurrence of the updating position index signal, counter 57 resumes its normal counting operation and accumulates counts up or down with respect to an updated and now correct count total.

Figure 7:
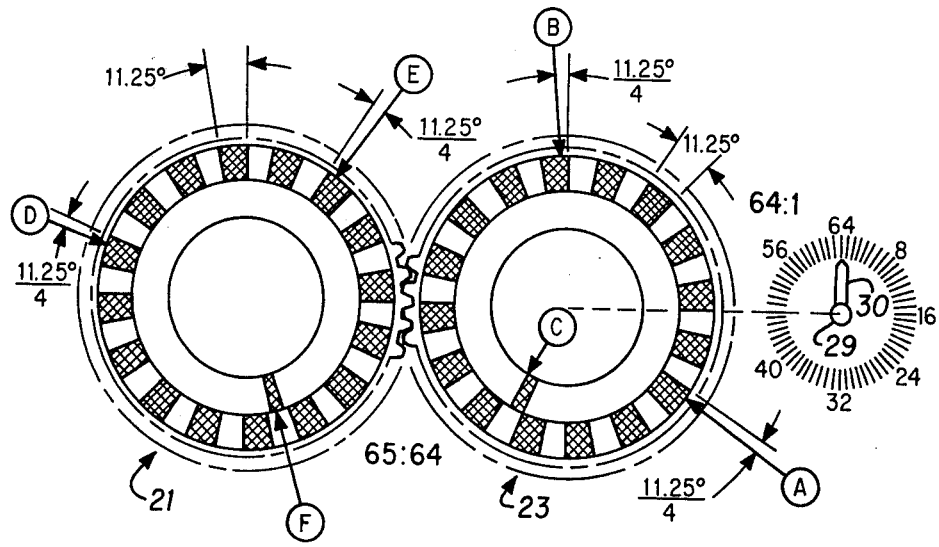
FIGS. 7 and 8 represent alternative embodiments of the present invention.
Figure 8:
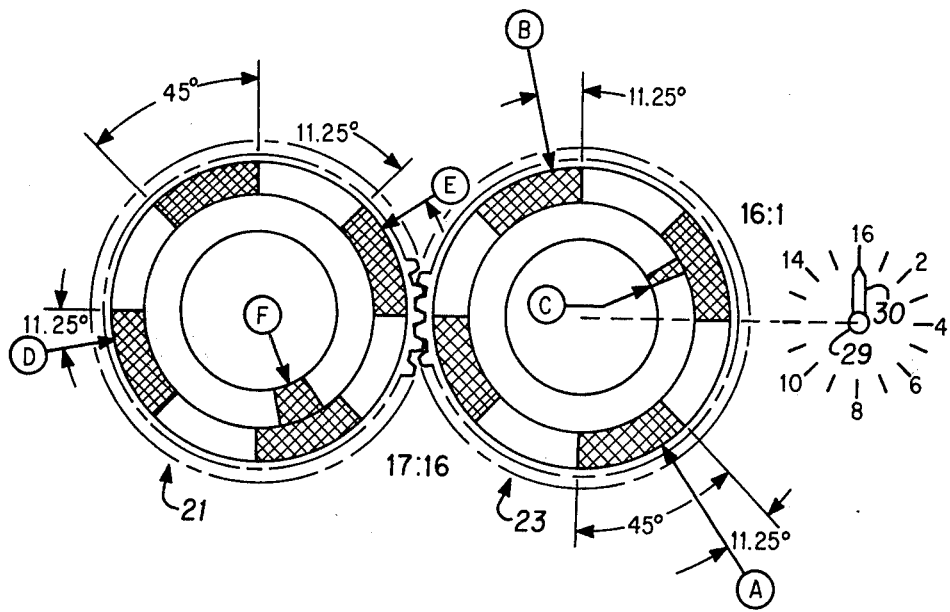

It is important to note that the inventive principles herein above set forth encompass many variations of the preferred embodiment. FIGS. 7 and 8 depict two such encoder embodiments. (In these figures where appropriate for purposes of clarity, notation analogous or the same as that previously employed for the preferred embodiment is employed.) The encoder of FIG. 7 indicates for 360° of rotation of pointer-bearing shaft 29, a total of 4096 different shaft positions. Furthermore, it generates a unique electrical signature for each of 64 of these 4096 positions of shaft 29 so that as with the preferred embodiment, absolute shaft position may be determined by a slight rotation of the shaft 29. The embodiment of FIG. 7 operates basically the same as the preferred embodiment of FIG. 1. The primary differences are the turns ratio of disc 21 to disc 23 to pointer 30, and the number of reflective and nonreflective areas on the outer tracks of discs 21 and 23. For FIG. 7, as shown, disc 21 turns 65 times, and disc 23 turns 64 times, per one 360° revolution of pointer bearing shaft 29. Discs 21 and 23 each have 16 reflective and 16 nonreflective alternating and substantially equiangular areas on their outside tracks. Each inner track still comprises one relatively small reflective area and one relatively large nonreflective area.

The sensors A, B, D, and E are again placed so that signals from A and B sensors (likewise D and E sensors) are substantially in phase quadrature. Sensors C and F are again placed so that position index and reference signals are appropriately located.

For this embodiment, each of the 64 unique electrical signatures comprises a unique number $\leq 64$ of D and E transitions and thus counter 61 in FIG. 4 should have a 6 bit capacity. Also counter 57 of FIG. 4 should have a 12 bit capacity.

The encoder of FIG. 8 indicates, for a 360° rotation of pointer-bearing shaft 29, a total of 256 different shaft positions and, for 16 of these shaft positions, generates a unique electrical signature. For FIG. 8, as shown, disc 21 turns 17 times, and disc 23 turns 16 times, per one 360° revolution of pointer-bearing shaft 29. Discs 21 and 23 each have four reflective and four nonreflective alternating and substantially equiangular areas on their outer tracks. Each inner track still comprises one relatively small reflective area and one relatively large nonreflective area. The sensors A through F are placed in accordance with the principles shown in regard to FIGS. 1, 3 and 7. For the FIG. 8 embodiment, each of the 16 unique electrical signatures comprises a unique number $\leq 16$ of D and E transitions and thus counter 61 in FIG. 4 should have a 4 bit capacity. Also, counter 57 of FIG. 4 should have an 8 bit capacity.

For the FIG. 7 embodiment, there are 64, 5.625° sectors around shaft 29 each demarcated by a pair of the 64 position index signals. Also, between each of the 64 position index signals, there are 64 A and B transitions. Thus, the total number of different shaft position indications is $64 \times 64 = 4096$. Also, the effect of disc 21 is to divide the 360° revolution of pointer 30 into 65 sectors each demarcated by a pair of reference signals. The J th reference signal always precedes the J th position index signal by a number J of D and E transitions and thus there is a unique electrical signature for each position index signal.

By analogy, the operation of the FIG. 8 embodiment is apparent.

It should further be noted that it is not necessary to have the same number of reflective and nonreflective areas on both discs. For instance, the preferred embodiment illustrated in FIG. 1 may be modified such that the outer track of disc 23 has practically any even number of alternating reflective and nonreflective areas instead of the illustrated number of 16. When the number of such alternating areas is 32, signals from A and B undergo 64 transitions per revolution of disc 23 (i.e., per position index signal). The total number of position index signals per 360° of shaft 29 rotation is still 32 but the total number of different shaft positions indicated is $32 \times 64 = 2048$. In like manner, when the number of alternating areas of disc 23 outer track is 8, or 10, or any even number $\gamma$, the total number of position index signals per 360° of shaft 29 rotation is still 32 but the total number of different shaft positions indicated is, for each example respectively, $32 \times 16 = 512$, $32 \times 20 = 640$, and $32 \times 2\gamma$. Similarly, for the embodiments of FIGS. 7 and 8, the outer track of discs 23 can have practically any even number $\gamma$ of alternating reflective and nonreflective areas. For each case, the number of position index signals per 360° of shaft 29 rotation is still, respectively, 64 and 16 but the total number of different shaft positions indicated is, respectively, $64 \times 2\gamma$, and $16 \times 2\gamma$. The maximum number of alternating areas is, of course, limited only by practical considerations such as resolution capabilities of the sensors and associated tracks.

It should further be noted that it is unnecessary for disc 21 to rotate a greater angle than disc 23 per some fixed rotation of pointer-bearing shaft 29. For instance, the FIG. 1 embodiment shows that disc 21 rotates 33 times, per one complete revolution of pointer-bearing shaft 29 while disc 23 rotates only 32 times. When the gear ratio is changed such that disc 21 rotates 31 times while pointer bearing shaft 29 and disc 23 still rotate one time and 32 times respectively, there are still 32 position index signals per 360° of revolution of pointer bearing shaft 29, and still 32 × 32 = 1024 different shaft positions indicated. The primary difference is that instead of 33 reference signals per 360° revolution of shaft 29 there are only 31 reference signals. But a unique number J of D and E transitions (for J from 0 through 31) still occurs between the J th position index signal and the J th reference signal.

If for such an embodiment it is desired to have the number of D and E transitions between the J th position index signal and the J th reference signal read out of counter 61 in FIG. 4 directly in absolute binary code, the direction of counting for counter 61 should be reversed, or a decoder employed at counter 61 output, or other alternative modification employed. For instance, at the first position index signal encountered during a clockwise rotation of shaft 29 from its 0° position, counter 61 without modification would read 31, or more particularly 11111, where for the preferred embodiment counter 61 reads 1, or 00001. Thus, it is seen that by reversing the count direction for the presently described modification, the count at the first encountered position index signal would also read 1 or 00001. An appropriate decoder may altenatively be used to achieve the desired readout.

Another possibility would be to leave the 5 bit counter 61 unchanged and to reverse the direction of count of the 10 bit counter 57 such that at the first encountered position index signal for CW rotation of pointer-bearing shaft 29, counter 57 output would read 1111100000 and the count of 31 (i.e., 11111) on the 5 bit counter would be the exact absolute binary code representation desired. The count here is 31 (i.e., 11111) since (32 − 1) = 31. This is, for the embodiments shown where D and E transitions are substantially regularly spaced, if there are J transitions between the J th position index and the J th reference signal, there is a unique number (K − J) of transitions (i) between the J th position index signal and the (J + 1) th reference signal for the embodiments where disc 21 rotates farther than disc 23; or (ii) between the J th position index signal and the (J − 1) th reference signal for the embodiments where disc 23 rotates farther than disc 21. K is of course equal to the total number of D and E transitions per 360° revolution of disc 21.

Figure 9:
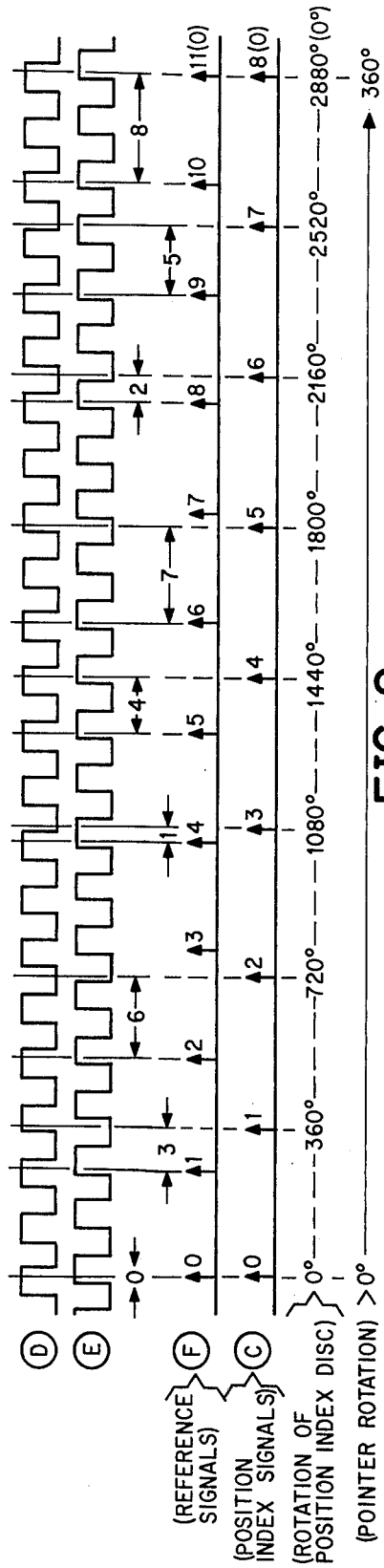
FIGS. 9 and 10 illustrate waveforms generated by further alternative embodiments of the present invention.

It should further be noted that, although it is highly preferable, it is not necessary that, per 360° revolution of pointer-bearing shaft 29, the number of turns of disc 21 and the number of turns of disc 23 differ by one. FIG. 9 illustrates the C, D, E, and F waveforms for an embodiment in which peer 360° revolution of a pointer-bearing shaft (analogous to the aforedescribed pointer-bearing shafts) a disc associated with waveforms D, E, and F rotates eleven times while a disc associated with A, B, and C waveforms rotates 8 times. As seen from the D and E waveforms in which there are a total of 8 (eight) D and E transitions between reference signals, this associated disc has a total of four alternating and equiangular reflective and nonreflective areas (two of each) in its outer track. The other disc outer track may have, as above described, practically any even number γ of reflective and nonreflective areas and thus waveforms A and B are not shown. There are eleven reference signals and eight position index signals per 360° revolution of the pointer. Between each of the position index signals and the reference signal just preceding each said position index signal (reading left to right) there is a unique number of D and E transitions. More particularly, reading left to right and starting from zero transitions between the zeroth reference signal and the zeroth position index signal, the Chart 1 below (and also FIG. 9) shows the number $T_1$ of D and E transitions between the U th reference signal and the V th position index signal.

Chart 1

| U | V | $T_1$ |
|---|---|---|
| 0 | 0 | 0 |
| 1 | 1 | 3 |
| 2 | 2 | 6 |
| 4 | 3 | 1 |
| 5 | 4 | 4 |
| 6 | 5 | 7 |
| 8 | 6 | 2 |
| 9 | 7 | 5 |
| 10 | 8 (same as 0) | 8, (or 0) |

It should be apparent that for counter 61 in FIG. 4 a 3 bit capacity would be sufficient and that if a 3 bit capacity were used, the counter output would be the same whether $T_1$ equaled 8 or 0. However, it should also be apparent that a decoder on the counter 61 output would be required if it were desired to have the absolute binary coded number available for updating or representing a particular position index signal 0 through 7.

Reading FIG. 9 from right to left there is, of course, also a unique number of D and E transitions between each position index signal and the reference signal just preceding it from the right. Thus, beween the eleventh (or zeroth) reference signal and the eighth (or zeroth) position index signal, there are 0 D and E transitions. Between the tenth reference signal and the seventh position index signal, there are 3 D and E transitions. Chart 2 below shows, reading FIG. 9 from right to left, the number $T_2$ of D and E transitions between the U th reference signal and the V th position index signal:

Chart 2

| U | V | $T_2$ |
|---|---|---|
| 11 (same as 0) | 8 (same as 0) | 0 |
| 10 | 7 | 3 |
| 9 | 6 | 6 |
| 7 | 5 | 1 |
| 6 | 4 | 4 |
| 5 | 3 | 7 |
| 3 | 2 | 2 |
| 2 | 1 | 5 |
| 1 | 0 | 8 (or 0) |

It should be noted that for each particular position index signal 0 through 7, each $T_2 = (8 − T_1)$. This is of course a result of there being, for the embodiment generating the FIG. 9 waveforms, 8 D and E transitions between reference signals, and is analogous to what was above described regarding the quantity (K − J).

Figure 10:
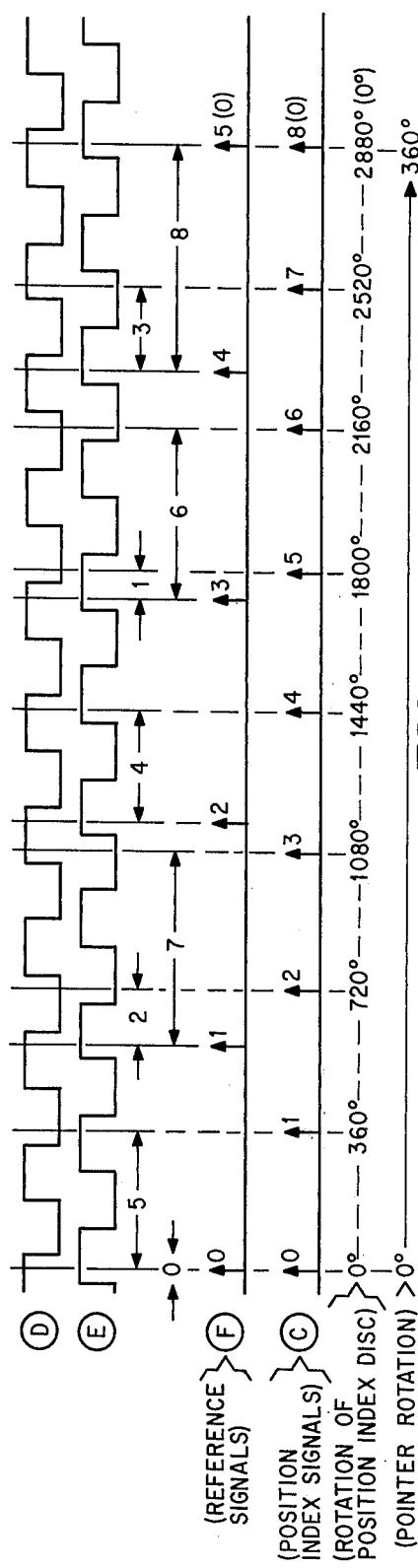

As a further example along the lines of FIG. 9, FIG. 10 illustrates the C, D, E and F waveforms for an embodiment in which, per 360° revolution of a pointer-bearing shaft (analogous to the aforedescribed pointer-bearing shaft) a disc associated with waveforms D, E and F rotates five times while a disc associated with A, B, and C waveforms rotates eight times. As seen from the D and E waveforms in which there are a total of eight D and E transitions between reference signals, this associated disc has a total of four alternating and equiangular reflective and nonreflective areas (two of each) in its outer track. The other disc outer track may have as above described practically any even number γ of reflective and nonreflective areas and thus waveforms A and B are not shown. There are five reference signals and eight position index signals per 360° revolution of the pointer. Between each of the position index signals and the reference signal just preceding each said position index signal (reading left to right) there is a unique number of D and E transitions. More particularly, reading left to right, the Chart 3 below (and also FIG. 10) shows the number $T_3$ of D and E transitions between the U th reference signal and the V th position index signal.

CHART 3

| U | V | $T_3$ |
|---|---|---|
| 0 | 0 | 0 |
| 0 | 1 | 5 |
| 1 | 2 | 2 |
| 1 | 3 | 7 |
| 2 | 4 | 4 |
| 3 | 5 | 1 |
| 3 | 6 | 6 |
| 4 | 7 | 3 |
| 4 | 8 (same as 0) | 8 (or 0) |

Reading FIG. 10 from right to left there is also a unique number of D and E transitions between each position index signal and the reference signal just preceding it from the right. Chart 4 below shows, reading from right to left, the number $T_4$ of D and E transitions between the U th reference signal and the V th position index signal.

CHART 4

| U | V | $T_4$ |
|---|---|---|
| 5 (same as 0) | 8 (same as 0) | 0 |
| 5 (same as 0) | 7 | 5 |
| 4 | 6 | 2 |
| 4 | 5 | 7 |
| 3 | 4 | 4 |
| 2 | 3 | 1 |
| 2 | 2 | 6 |
| 1 | 1 | 3 |
| 1 | 0 | 8 (or 0) |

Similar to the comments above in regard to FIG. 9, a decoder at the output of a counter for the reference signals may be employed in order to provide the output in absolute binary code.

Figure 11:
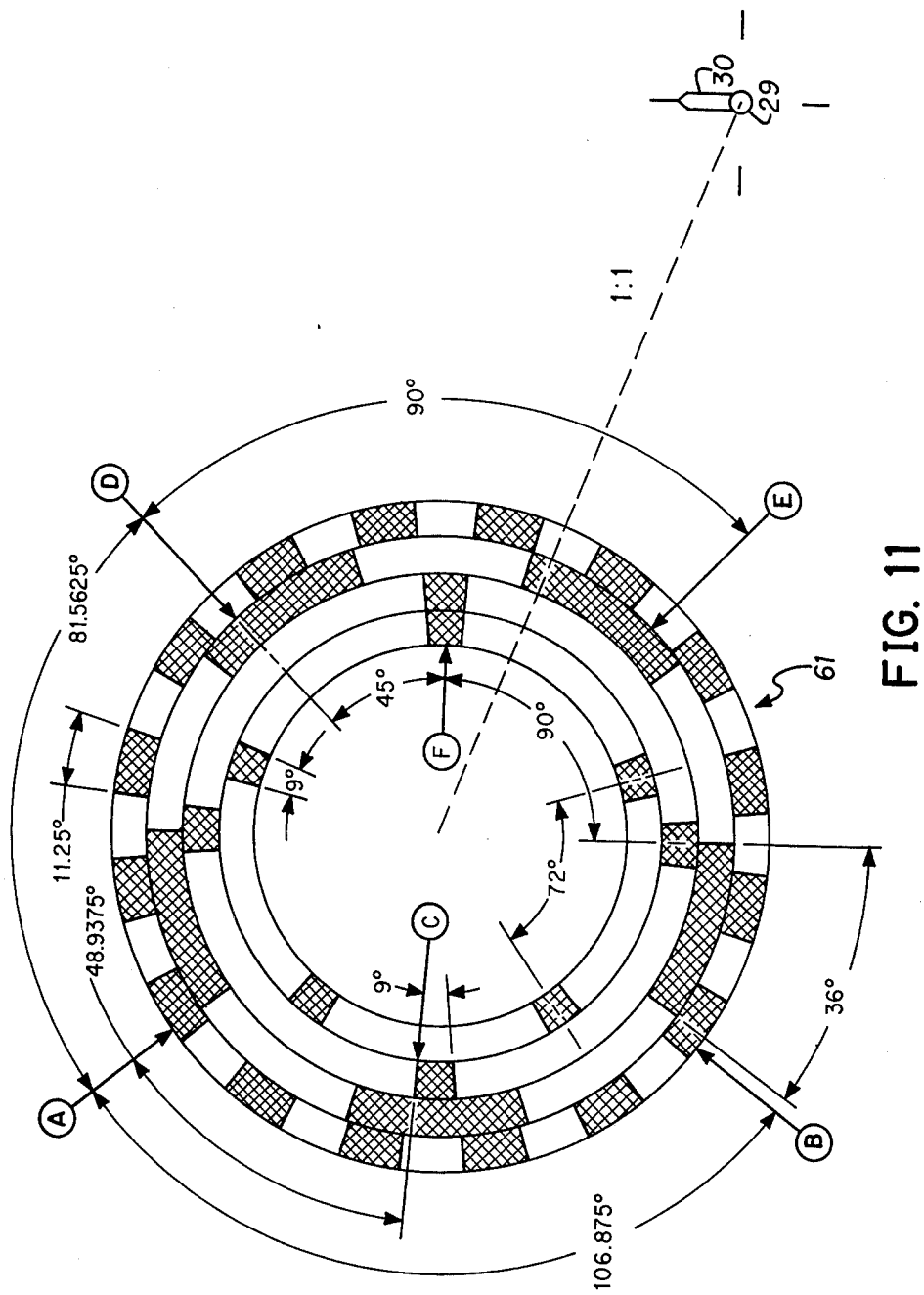
FIG. 11 represents a further alternative embodiment of the present invention.
Figure 12:
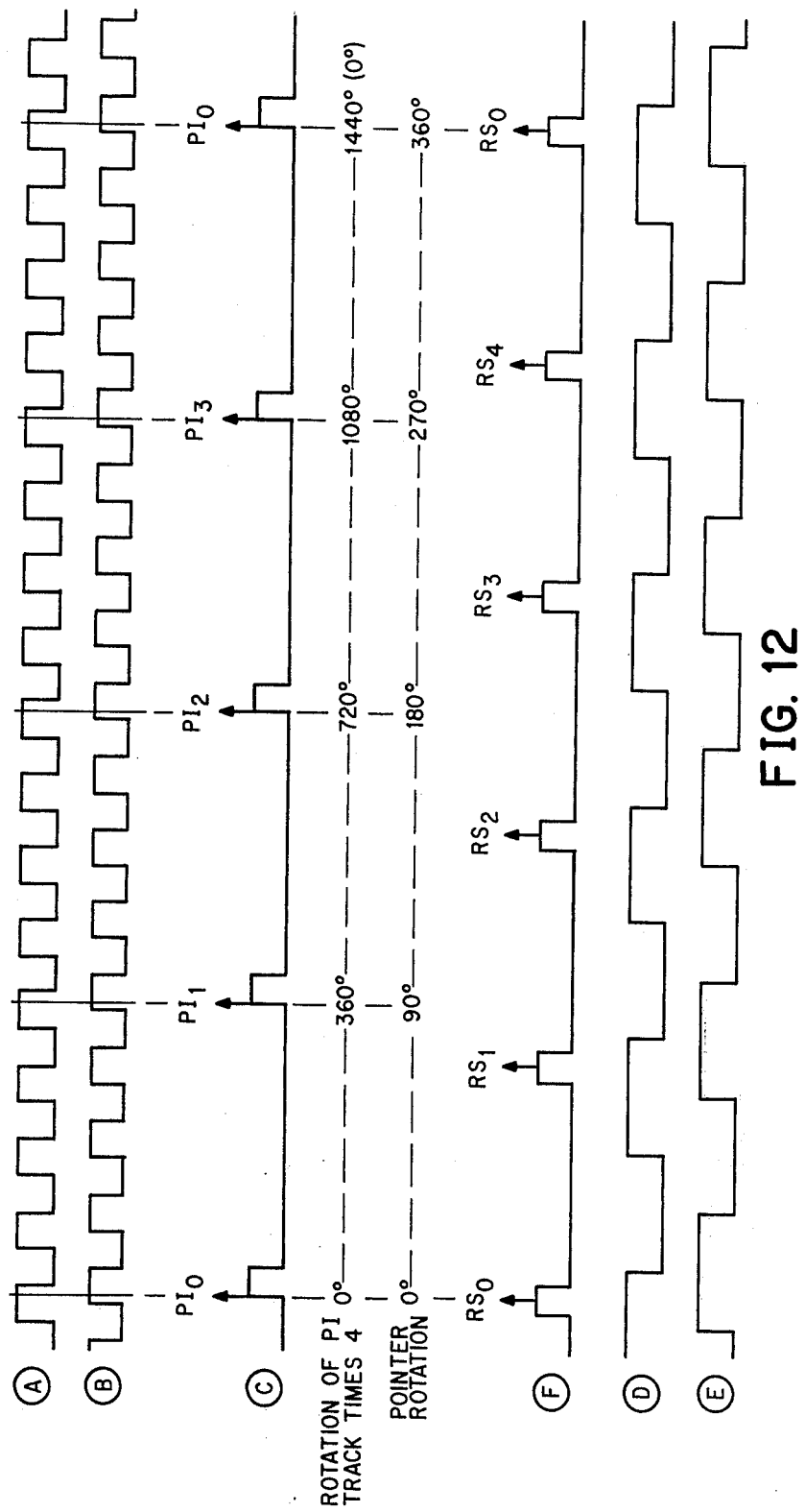
FIG. 12 illustrates waveforms useful in explaining the operation of the FIG. 11 embodiment.

It should further be noted that, although it is preferred, it is not necessary that the principles of the present invention be embodied in two encoded discs as heretofore described. For example, FIG. 11 shows an embodiment having four tracks of reflective and nonreflective areas on one disc 61, and which is operationally analogous to the FIGS. 1, 7 and 8 embodiments. As shown in FIG. 12, the waveforms A through F generated by the FIG. 11 embodiment for a clockwise rotation of disc 61 are identical to those which would be generated by a FIG. 1 embodiment incorporating the following changes: (i) discs 21 and 23 having totals of 2 and 8, respectively, alternating and equiangular reflective and nonreflective areas in their outer tracks instead of, as in the FIG. 1 illustration, 16 and 16 respectively; (ii) discs 21 and 23 rotating respectively 5 and 4 times for each 360° C revolution of pointer-bearing shaft instead of, as in the FIG. 1 illustration, 33 and 32 times respectively; (iii) relocating sensor pairs A/B and D/E so that the 90° electrical relationship is maintained between pair members; and (iv) widening the inner track reflective areas of discs 21 and 23 to subtend 45° and 36° respectively instead of, as in the FIG. 1 illustration, 33.75° and 13.5° respectively.

Numbered from innermost to outermost, the first and third cyclic tracks of disc 61 in FIG. 11 correspond to the two cyclic tracks of disc 21 in FIGS. 1, 7, and 8 and the second and fourth cyclic tracks correspond to the two cyclic tracks of disc 23 in FIGS. 1, 7, and 8. Per 360° of pointer-bearing shaft rotation there are four position index signals and five reference signals. (Note however, in comparison with the above described two disc equivalent embodiment, one revolution of disc 21 and one revolution of disc 23 would correspond respectively to, in terms of rotation of disc 61, 72° and 90°.) There are 16 A and B transitions for each position index signal and thus the total number of different pointer-bearing shaft positions indicated is $4 \times 16 = 64 = 2^6$. Also, for $J = 0$ through 4 and reading FIG. 12 left to right (i.e., assuming a clockwise rotation of disc 61 from its illustrated 0° position) there is a unique number J of D and E transitions between the J th reference signal and the J th position index signal. Thus, each of four pointer-bearing shaft 29 positions has, as before, a unique electrical signature, and absolute shaft position at any of the four tick marked positions shown in determinable. Similar to aforedescribed embodiments, there is also a unique number $(K - J)$ of D and E transitions between the J th position index signal and the $(J + 1)$ th reference signal, where K here is equal to four.

A further modification of the preferred embodiment, in which sensors A and B and their associated track are either not employed or are not present, should be noted. For example, if in FIG. 1 sensors A and B and the outer track of disc 23 are removed, signals from sensors C, D, E, and F are unaltered, and thus there are still provided, 33 reference signals and 32 position index signals per 360° rotation of pointer 30, and a unique number J of D and E transitions between the J th reference signal and the J th position index signal. Moreover, there are a total of $32 \times 33 = 1056$ D and E transitions substantially regularly distributed throughout the 360° of pointer rotation and these may be used to indicate 1056 different shaft positions instead of, as described in conjunction with FIG. 1, the $32 \times 32 = 1024$ A and B transitions to indicate 1024 different shaft positions. As with the FIG. 1 embodiment, each of 32 positions of pointer 30 still has associated with it a unique electrical signature. A primary difference in result is that since the number of indicated rotational increments of pointer 30 per 360° rotation thereof is larger than previously (i.e., 1056 vs. 1024) each indication represents a smaller increment of pointer rotation.

It should also be pointed out that the number of transitions between the J th reference signal and the J th position index signal, although it is still always a unique number J, is not an absolute binary code representation of the binary word desired for updating the type of processor shown in FIG. 4. For instance, and with reference to FIG. 4, (and noting that counter 57 should now have an eleven bit capacity) the output of couner 57 at the third position index signal for the presently discussed modification should be 00001100011. Also, at the third position index signal, the output of counter 61 will be 00011. Thus, as is seen from the lack of correspondence between outputs in this example, a decoder is required between the five outputs of counter 61 and the parallel data inputs (eleven required for this modification and none of which are grounded) of counter 57 to translate each one of the 32 unique 5 bit words from counter 61, each of which occurs at a position index signal, into an appropriate one of 32 unique eleven bit words for updating counter 57.

Continuing further with the presently discussed type of modification, a particularly useful embodiment comprises the FIG. 1 embodiment which incorporates the following changes: (i) the gearing is altered so that, per 360° revolution of pointer-bearing shaft 29, disc 23 rotates 32 times and disc 21 rotates 45 times; and (ii) sensors A and B and their associated track are either not present or are not employed. For such an embodiment, there are 45 reference signals, 32 position index signals, and 45 × 32 = 1440 D and E transitions per 360° revolution of the pointer. For a CW rotation of disc 23, there is a unique number $T_5$ (as shown in Chart 5) of D and E transitions between each of the position index signals and the reference signal just preceding each said position index signal. More particularly, Chart 5 below shows the number $T_5$ of D and E transitions between the V th one of 32 position index signals and the rotationally preceding U th reference signal. (Of course, analogous to a reading of FIG. 9 from right to left, there is also, for CCW rotation of disc 23, a unique number of D and E transitions between each one of 32 position index signals and the rotationally preceding reference signal.)

CHART 5

| U | V | $T_5$ | U | V | $T_5$ | U | V | $T_5$ |
|---|---|---|---|---|---|---|---|---|
| 0 | 0 | 0 | 16 | 12 | 28 | 32 | 23 | 11 |
| 1 | 1 | 13 | 18 | 13 | 9 | 33 | 24 | 24 |
| 2 | 2 | 26 | 19 | 14 | 22 | 35 | 25 | 5 |
| 4 | 3 | 7 | 21 | 15 | 3 | 36 | 26 | 18 |
| 5 | 4 | 20 | 22 | 16 | 16 | 37 | 27 | 31 |
| 7 | 5 | 1 | 23 | 17 | 29 | 39 | 28 | 12 |
| 8 | 6 | 14 | 25 | 18 | 10 | 40 | 29 | 25 |
| 9 | 7 | 27 | 26 | 19 | 23 | 42 | 30 | 6 |
| 11 | 8 | 8 | 28 | 20 | 4 | 43 | 31 | 19 |
| 12 | 9 | 21 | 29 | 21 | 17 | 44 | 32 | 32 |
| 14 | 10 | 2 | 30 | 22 | 30 | 45 | 32 | 0 |
| 15 | 11 | 15 | | | | | | |

Thus, it is seen that, as before, each of the 32 position index signals, and thus each of 32 pointer positions, has associated with it a unique electrical signature. However, as discussed above, a counter of eleven bit capacity is required for counter 57 of FIG. 4, and a decoder is necessary to translate each one of the 32 unique 5 bit words from counter 61, each of which occurs at a position index signal, into an appropriate one of 32 unique eleven bit words for updating counter 57. The particularly attractive feature of this embodiment is that the number of indicated rotational increments of pointer 30 per 360° rotation thereof, i.e., 1440, is an exact multiple of 360. Accordingly, in this particular case, since 4 × 360 = 1440, each indicated rotational increment of pointer 30 is exactly 0.25°.

Thus, while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. Shaft position encoder means comprising:
    a. first means including a first coded track and an associated first sensor means between which relative movement is caused by rotation of said shaft, said first sensor means being arranged so as to be sensitive only to said first track, and said first sensor means generating, in response to said relative movement within said first means, a first signal at each of substantially regular angular intervals α of rotation of said shaft.
    b. second means including a second coded track and an associated second sensor means between which relative movement is also caused by rotation of said shaft, said second sensor means being arranged so as to be sensitive only to said second track, and said second sensor means generating, in response to said relative movement within said second means, a second signal at each of substantially regular angular intervals β of rotation of said shaft, where β=M/N×α, and M and N are positive intergers >1 which contain no prime factor, other than the prime number one, which is common to both, and
    c. third means including a third coded track and an associated third sensor means between which relative movement is also caused by rotation of said shaft, said third sensor means being arranged so as to be sensitive only to said third track, and said third sensor means generating, in response to said relative movement within said third means, a voltage or current transition at each of substantially regular angular intervals β/M/k of rotation of said shaft where $k$ is a positive integer,
    whereby for a predetermined direction and amount of shaft rotation each positionally different first signal has associated therewith a corresponding and identifying electrical signature comprising a predetermined number of said transitions occurring between the associated first signal and the second signal last occurring prior to the associated first signal, each said electrical signature being different from all the other electrical signatures within said predetermined amount of shaft rotation in that each said electrical signature comprises a different number of said transitions.

2. Apparatus as defined in claim 1 wherein said first and second sensor means comprise first and second sensors respectively, and said third sensor means comprises third and fourth sensors arranged relative to one another along said third track such that said third and fourth sensors alternate in generating said transitions.

3. Apparatus as defined in claim 2 wherein k=1.

4. Apparatus as defined in claim 3 wherein M×α=N×β=360° of shaft rotation.

5. Apparatus as defined in claim 4 wherein (M×N/360 is a positive integer.

6. Apparatus as defined in claim 5 wherein M=32 and N=45.

7. Apparatus as defined in claim 2 including a fourth means comprising a fourth coded track and associated fifth and sixth sensors arranged so as to be sensitive only to said fourth track, relative movement between said fourth track and its associated sensors also being caused by rotation of said shaft, said fourth means generating, in response to said relative movement within said fourth means, a voltage or current transition at each of substantially regular angular intervals α/P of rotation of said shaft where P=2γ and γ is a positive even integer, said fifth and sixth sensors being arranged relative to one another and relative to said fourth track such that said fifth and sixth sensors alternate in generating said transitions occurring at said $\alpha/P$ intervals.

8. Apparatus as defined in claim 7 wherein $P=2^S$ where S is a positive integer $>1$.

9. Apparatus as defined in claim 8 wherein P is equal to any one of the following values: 16, 32, or 64.

10. Apparatus as defined in claim 9 wherein $k=1$.

11. Apparatus as defined in claim 10 wherein $M \times \alpha = N \times \beta = 360°$ of shaft rotation.

* * * * *

UNITED STATES PATENT AND TRADEMARK OFFICE
CERTIFICATE OF CORRECTION

PATENT NO. : 4,041,483
DATED : August 9, 1977
INVENTOR(S) : Alvin H. Groff

It is certified that error appears in the above-identified patent and that said Letters Patent are hereby corrected as shown below:

IN THE TITLE
Between "Absolute" and "Incremental", insert a hyphen so as to read
--Absolute-Incremental--.

Column 6, line 37, delete "point-bearing" and substitute therefor
--pointer-bearing--.
Column 7, line 15, delete "point" and substitute therefor --pointer--.
Column 7, line 39, after "C" and before "AND'ed", delete "and" and
substitute therefor --are--.
Column 7, line 45, after "53", delete "and" and substitute therefor --are--.
Column 7, line 60, delete "desc" and substitute therefor --disc--.
Column 8, line 23, after "employed", delete "by" and substitute --to--.
Column 8, line 37, delete "output" and substitute therefor --outputs--.
Column 11, line 60, delete "peer" and substitute therefor --per--.
Column 12, line 38, delete "beween" and substitute therefor --between--.
Column 13, Chart 3, relocate the second "0" in the "U" column so that
same appears directly underneath the first "0" in the "U" column.
Column 13, line 67, delete "C" after 360°.
Column 14, line 28, delete "in" and substitute therefor --is--.
Column 14, line 63, delete "couner" and substitute therefor --counter--.

UNITED STATES PATENT AND TRADEMARK OFFICE
CERTIFICATE OF CORRECTION

PATENT NO. : 4,041,483

DATED : August 9, 1977

INVENTOR(S) : Alvin H. Groff

It is certified that error appears in the above-identified patent and that said Letters Patent are hereby corrected as shown below:

Column 16, line 7, after "shaft", delete the period "." and substitute therefor a comma --,--.

Column 16, line 17, delete "M/Nxα" and substitute therefor --$\frac{M}{N}x\alpha$--.

Column 16, line 28, delete "β/M/k" and substitute therefor --$\frac{\beta/M}{\kappa}$--.

Column 16, lines 29 and 48, delete "k" and substitute therefor --κ--.

Column 16, line 52, before "M", delete the parenthesis --(--.

Column 18, line 3, delete "k" and substitute therefor --κ--.

*Signed and Sealed this*

*Sixth* Day of *December 1977*

[SEAL]

*Attest:*

RUTH C. MASON
*Attesting Officer*

LUTRELLE F. PARKER
*Acting Commissioner of Patents and Trademarks*